(12) United States Patent
Akamatsu et al.

(10) Patent No.: US 6,356,144 B1
(45) Date of Patent: Mar. 12, 2002

(54) LSI CORE INCLUDING VOLTAGE GENERATION CIRCUIT AND SYSTEM LSI INCLUDING THE LSI CORE

(75) Inventors: Hironori Akamatsu; Yutaka Terada, both of Hirakata; Takashi Hirata, Moriguchi; Tadahiro Yoshida; Yoshihide Komatsu, both of Osaka, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/580,139

(22) Filed: May 30, 2000

(30) Foreign Application Priority Data

Jun. 1, 1999 (JP) .......................................... 11-154408

(51) Int. Cl.[7] .............................................. H01L 25/00
(52) U.S. Cl. ...................................... 327/565; 327/545
(58) Field of Search ................................ 327/530, 534, 327/535, 537, 538, 540, 545, 546, 564, 565, 566

(56) References Cited

U.S. PATENT DOCUMENTS

| 4,307,307 A | * 12/1981 | Parekh ........................ 307/297 |
| 6,087,895 A | * 7/2000 | Ono ............................ 327/565 |
| 6,121,827 A | * 9/2000 | Khoini-Poorfard et al. . 327/565 |

* cited by examiner

*Primary Examiner*—Jeffrey Zweizig
(74) *Attorney, Agent, or Firm*—Renner, Otto, Boiselle & Sklar

(57) ABSTRACT

An LSI core includes a first terminal; a second terminal; and a voltage generation circuit for generating a voltage. The first terminal is connected to a first external line provided outside the LSI core. The second terminal is connected to the first external line and to a second external line provided outside the LSI core. The voltage generation circuit includes a voltage generation section for generating the voltage, an output section for outputting the voltage generated by the voltage generation section to the first external line through the first terminal, and an input section for receiving the voltage, output to the first external line by the output section, through the second external line and the second terminal.

6 Claims, 5 Drawing Sheets

LSI CORE INCLUDING VOLTAGE GENERATION CIRCUIT AND SYSTEM LSI INCLUDING THE LSI CORE

BACKGROUND OF THE INVENTION

1. Field of the Invention

The present invention generally relates to an LSI core including a voltage generation circuit and a system LSI including such an LSI core, and in particular to an LSI core and a system LSI mountable on a semiconductor integrated circuit performing high speed data transfer.

2. Description of the Related Arts

The IEEE 1394 standards include physical standards and electric standards of connectors, and standards regarding the most basic signal sending and receiving.

A semiconductor integrated circuit represented by an IEEE 1394 physical layer LSI utilizes a technology for performing inter-device data transfer at a high speed. This technology is especially useful in fields which require a large amount of data to be processed at a high speed, for example, in the field of multimedia. The data transfer rate between semiconductor integrated circuits in accordance with the IEEE 1394 standards is 200 Mbps in the case of products now practically used, and 400 Mbps in the case of samples which are shipped today. On a research level, a technology for transferring data at a rate exceeding 1 Gbps has been developed.

For transferring data, a sending-side IEEE 1394 physical layer LSI outputs data to differential twisted paired cables in the form of a DC current. The current flowing through a resistor connected between the twisted paired cables generates a potential difference between the twisted paired cables. The potential difference is input to a receiving-side IEEE 1394 physical layer LSI.

In accordance with the standard of the IEEE 1394 physical layer LSI, as described in the IEEE 1394, draft standard, ver. 8.4, the potential difference between the twisted paired cables is used as data, and a common-mode voltage level of the twisted paired cables is also used as data. In order to allow the common-mode voltage level to be used as data, a common-mode voltage generation circuit is provided in the LSI.

Recently, the integration degree of LSIs has been raised due to the improvement in processing technologies, and thus system LSIs having many functions have been developed. An IEEE 1394 physical layer LSI is often mounted on a system LSI as a core, which complicates the design of the system LSI.

FIG. 5 is a block diagram illustrating a structure of a conventional IEEE 1394 physical layer LSI core (hereinafter, referred to as an "LSI core") 510.

A system LSI 500 is connected to an external bus line 540 conforming to the IEEE 1394 standards. The system LSI 500 performs data transfer in conformity to the IEEE 1394 standards through an external device (not shown) and the external bus line 540. The external bus line 540 is connected to various loads including the external device. Herein, those loads are equivalently shown as a current load 550.

The system LSI 500 includes an LSI core 510 and a pad 530.

The LSI core 510 has the function of an IEEE 1394 physical layer. The pad 530 connects an internal circuit of the system LSI 500 and the external bus line 540. Specifically, the pad 530 connects the LSI core 510 and the external bus line 540.

The LSI core 510 includes a termination voltage generation circuit 520 for generating a termination voltage, and an output terminal 512 for outputting the termination voltage. The LSI core 510 can include other functional circuits not shown, which do not need to be specifically described herein. In the conventional example shown in FIG. 5, the term "termination voltage" is as a voltage which is output from an output section 522 of the termination voltage generation circuit 520.

The termination voltage generation circuit 520 generates a voltage having a prescribed level. The level of the voltage is used as a data Signal as described above regarding the IEEE 1394 physical layer LSI. The termination voltage generation circuit 520 supplies the generated voltage to the output terminal 512 and to the external bus line 540 through the pad 530 as a termination voltage.

The termination voltage generation circuit 520 includes an output section 522, an input section 524, a comparator circuit 526, and a reference voltage generation circuit 528. The termination voltage generation circuit 520 outputs the generated voltage from the output section 522. The termination voltage generation circuit 520 also receives the termination voltage from a voltage supply line provided between the output section 522 and the output terminal 512 of the LSI core 510. The received termination voltage is input to the comparator circuit 526 through the input section 524. The comparator circuit 526 compares the termination voltage which is input through the input section 524 and a desired termination voltage to be output. In response to the comparison result, a control section (not shown) of the termination voltage generation circuit 520 corrects the voltage from the comparator circuit 526 to make the voltage closer to the desired termination voltage. Then, the corrected voltage is output as a termination voltage from the output section 522.

The reference voltage generation circuit 528 generates a voltage having a prescribed level as a reference voltage and supplies the reference voltage to the comparator circuit 526.

The conventional system LSI 500 structured and operated as described above has the following problem.

While the system LSI 500 is connected to the external bus line 540, the level of the termination voltage is lowered by the current load 550 and a resistance of a line connecting the pad 530 and the output terminal 512. In other words, the voltage output from the pad 530 is lower than the actual termination voltage output from the output section 522 of the termination voltage generation circuit 520.

The termination voltage generation circuit 520 supplies the termination voltage from the output section 522 on the precondition that the termination voltage is supplied to the pad 530 while maintaining the level thereof.

However, in actuality, the level of the termination voltage is lowered outside the LSI core 510. The termination voltage generation circuit 520 can receive the voltage in the LSI core 510 as a monitored voltage through the input section 524 but cannot detect the voltage drop which occurs outside the LSI core 510.

Accordingly, the desired termination voltage cannot be output from the pad 530 of the system LSI 500. This is a defect peculiar to system LSIs having an IEEE 1394 physical layer core mounted thereon.

SUMMARY OF THE INVENTION

According to one aspect of the invention, an LSI core includes a first terminal; a second terminal; and a voltage generation circuit for generating a voltage. The first terminal is connected to a first external line provided outside the LSI core. The second terminal is connected to the first external line and to a second external line provided outside the LSI core. The voltage generation circuit includes a voltage generation section for generating the voltage, an output section for outputting the voltage generated by the voltage generation section to the first external line through the first terminal, and an input section for receiving the voltage, output to the first external line by the output section, through the second external line and the second terminal.

In one embodiment of the invention, the LSI core is a physical layer LSI core conforming to the IEEE 1394 standards.

According to another aspect of the invention, a system LSI includes an LSI core; a pad; a first line connected to the pad; and a second line connected to the first line. The LSI core includes a first terminal, a second terminal, and a voltage generation circuit for generating a voltage. The first terminal is connected to the first line provided outside the LSI core. The second terminal is connected to the second line provided outside the LSI core. The voltage generation circuit includes a voltage generation section for generating the voltage, an output section for outputting the voltage generated by the voltage generation section to the first line through the first terminal, and an input section for receiving the voltage, output to the first line by the output section, through the second line and the second terminal. The second line is connected to the first line in the vicinity of the pad.

In one embodiment of the invention, the system LSI further includes a third line for supplying power to the voltage generation circuit, wherein the third line is provided in proximity of the first line.

In one embodiment of the invention, the LSI core is a physical layer LSI core conforming to the IEEE 1394 standards.

In one embodiment of the invention, the LSI core is a physical layer LSI core conforming to the IEEE 1394 standards.

According to still another aspect of the invention, a system LSI includes an LSI core. The LSI core includes a pad and a voltage generation circuit for generating a voltage to be supplied to the pad. The system LSI outputs the voltage outside the system LSI using the pad.

According to the present invention, the input section of the generation voltage circuit receives, through the second terminal, a voltage which has been output outside the LSI core. Since the output which has been once output outside the LSI core from the voltage generation circuit is re-input to the voltage generation circuit, even when the level of the voltage is changed outside the LSI core, the voltage generation circuit can monitor the changed level of the voltage.

In an embodiment in which the second terminal is provided in the vicinity of the pad, the voltage which is output outside the system LSI from the pad can be monitored.

In an embodiment in which the third line for supplying power to the voltage generation circuit is provided in proximity of the first line, an effective inductance of the first line for supplying the voltage to the pad can be reduced, and thus noise caused by the inductance component can be reduced.

In an embodiment in which the pad and the voltage generation circuit are provided in the LSI core and the system LSI outputs a voltage generated in the voltage generation circuit using the pad of the LSI core, the distance between the pad and the voltage generation circuit is shorter than the case in which the pad is provided outside the LSI core. Accordingly, the resistance of the line from the voltage generation circuit to the pad is smaller, and thus the voltage drop can be reduced. In an embodiment in which the distance between the pad and the voltage generation circuit in the LSI core are shorter still, the magnitude of the voltage drop can be further reduced. Since the line resistance is predictable in such a case, the voltage generation circuit can output a voltage which is higher than the desired voltage by a magnitude of the voltage drop caused by the predictable line resistance. Thus, a desired voltage can always be output from the pad. This alleviates the burden on system designers of the system LSI and allows the system LSI to be designed more quickly and more easily.

Thus, the invention described herein makes possible the advantages of providing an LSI core for outputting a desired voltage to an external device in consideration of a voltage drop occurring in the system LSI; and a system LSI including such an LSI core.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
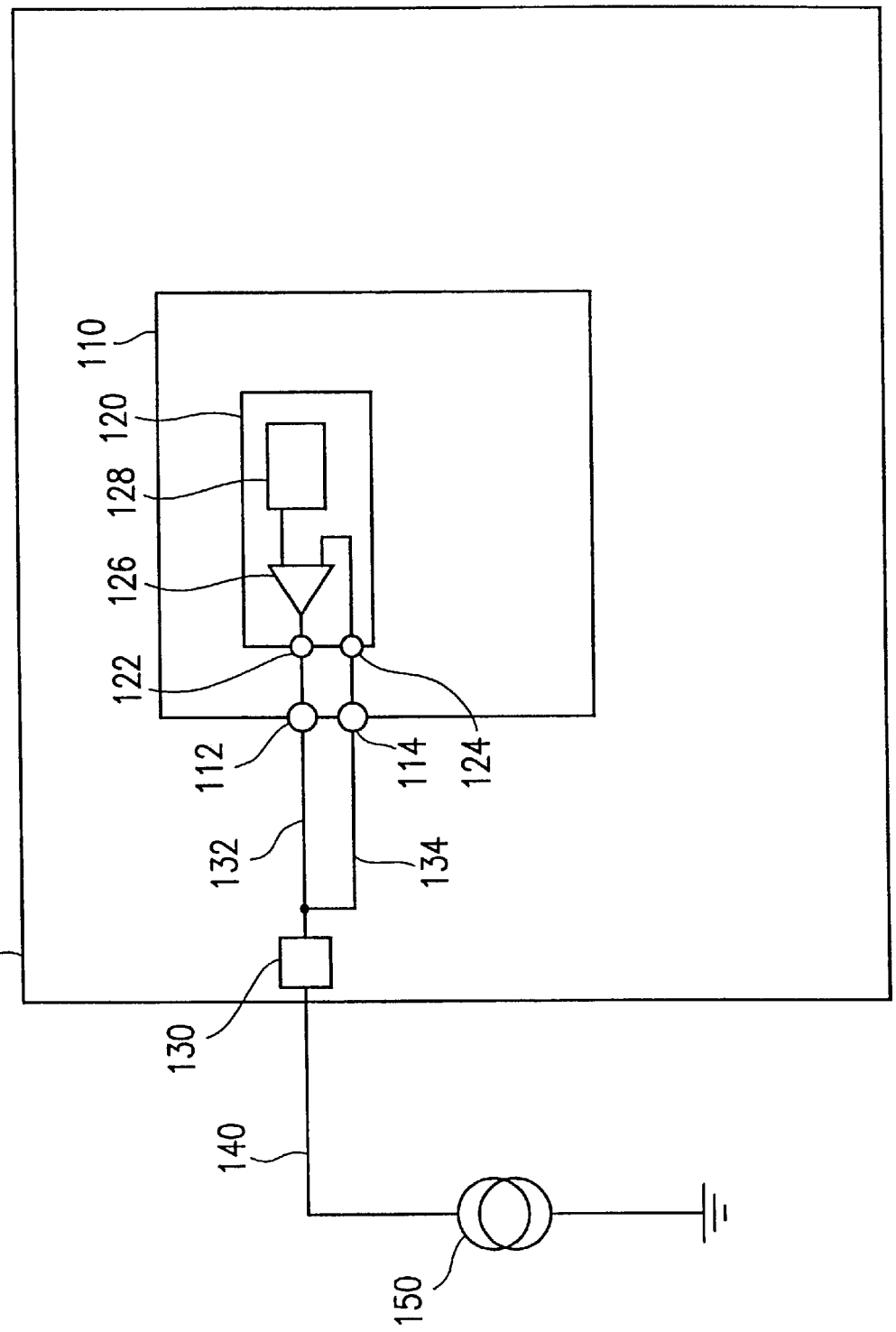
FIG. 1 is a block diagram illustrating a structure of a system LSI 100 in a first example of the present invention.

FIG. 1 is a block diagram illustrating an exemplary structure of a system LSI 100 of a first example according to the present invention.

The system LSI 100 can be an LSI including circuits integrated therein having a function of processing multimedia data, a function of controlling a system, and the like.

The system LSI 100 is connected to an external bus line 140 conforming to the IEEE 1394 standards. The system LSI 100 performs data transfer in conformity to the IEEE 1394 standards through an external device (not shown) and the external bus line 140. The external bus line 140 is connected to various loads including the external device. Herein, those loads are equivalently shown as a current load 150.

The system LSI 100 includes an LSI core 110 and a pad 130.

The LSI core 110 has the function of an IEEE 1394 physical layer. The pad 130 connects an internal circuit of the system LSI 100 and the external bus line 140. Specifically, the pad 130 connects the LSI core 110 and the external bus line 140.

The LSI core 110 includes a termination voltage generation circuit 120 for generating a termination voltage, an output terminal 112 for outputting the termination voltage, and a monitor terminal 114 for monitoring the termination voltage output from the output terminal 112. In the following description of the present invention, the term "termination voltage" is defined as a voltage output from the output section 122 (described later) of the termination voltage generation circuit 120; and the term "termination bus voltage" is defined as a voltage output from the pad 130 of the system LSI 100 to the external bus line 140. The LSI core 110 can include other functional circuits (not shown), which do not need to be specifically described herein.

In the system LSI 100, the output terminal 112 of the LSI core 110 is connected to the pad 130 through a termination voltage supply line 132. The monitor terminal 114 is connected to a voltage monitor line 134. The voltage monitor line 134 is connected to the termination voltage supply line 132 in the vicinity of the pad 130. In this specification, the phrase "in the vicinity of" refers to a distance which is sufficiently short relative to the length of the termination voltage supply line (represented by reference numeral 132 in the first example). The monitor terminal 114 as described above monitors the termination voltage output from the output terminal 112, but in actuality, it can be appreciated from the above description that a termination bus voltage can be monitored using the monitor terminal 114.

When the system LSI 100 having the above-described structure is connected to the external bus line 140 having the current load 150, the level of the termination bus voltage is lowered from the level of the termination voltage due to the current load 150 and the resistance of the termination voltage supply line 132 connecting the output terminal 112 and the pad 130. Hereinafter, the termination voltage generation circuit 120 for outputting a termination voltage in consideration of the voltage drop will be described with an exemplary operation thereof.

The terminate on voltage generation circuit 120 generates a voltage having a prescribed level, and outputs the voltage as a data signal, in order to use the level of the voltage as a signal as described above regarding the IEEE 1394 physical layer LSI.

The termination voltage generation circuit 120 includes an output section 122, an input section 124, a comparator circuit 126, and a reference voltage generation circuit 128.

The reference voltage generation circuit 128 generates a voltage having a prescribed level as a reference voltage, and supplies the reference voltage to the comparator circuit 126.

The input section 124 receives the termination voltage output from the output section 122 in order to monitor the termination voltage. More specifically, the input section 124 is connected to the monitor terminal 114. Accordingly, when the termination voltage output from the output section 122 is supplied to the pad 130 as a termination bus voltage, the input section 124 receives the termination bus voltage through the voltage monitor line 134 and the monitor terminal 114. The termination bus voltage received by the input section 124 is input to the comparator circuit 126.

The comparator circuit 126 receives a reference voltage from the reference voltage generation circuit 128 and the termination bus voltage having a level lowered from the level of the termination voltage, and compares the reference voltage and the terminal bus voltage. In response to the comparison result, a control section (not shown) of the termination voltage generation circuit 120 can determine the difference between the termination bus voltage and the termination voltage. The control section increases the output voltage from the comparator circuit 126 by the amount of voltage drop and thus corrects the level of the termination voltage to be output from the termination voltage generation circuit 120.

The output section 122 outputs the voltage from the comparator circuit 126 as the termination voltage. Since the output section 122 is connected to the output terminal 112, the termination voltage is supplied to the termination voltage supply line 132 provided outside the LSI core 110 through the output terminal 112, and is further output to the external bus line 140 through the pad 130 as the termination bus voltage.

As described above, since the comparator circuit 126 of the termination voltage generation circuit 120 receives a termination bus voltage, the termination voltage generation circuit 120 can output a termination voltage in consideration of the voltage drop which is caused by the resistance of the termination voltage supply line 132. Accordingly, a desired termination bus voltage can be supplied from the pad 130 to the external bus line 140.

Hence, since system designers of the system LSI 100 do not need to consider the line resistance, the burden on the system designers is alleviated. As a result, the time period required to design the system LSI 100 can be shortened.

The comparator circuit 126 does not act as a current load to the input from the monitor terminal 114. Accordingly, the resistance of the voltage monitor line 134 and the line connecting the monitor terminal 114 to the comparator 126 through the input terminal 124 does not cause a voltage drop.

In the first example, the LSI core 110, the external bus line 140 and the like are described to be conformed to the IEEE 1394 standards. However, the present invention is not limited to the use of an LSI core, an external bus line or the like conformed to the IEEE 1394 standards.

In the first example, the voltage drop of a termination voltage is compensated for. The present invention is applicable to any system which causes a voltage drop.

According to the first example of the present invention, a desired voltage can be output in consideration of a voltage drop by monitoring a voltage output outside the LSI core and correcting the voltage. This effect is achieved by all the following examples and any possible example of the present invention which are not specifically described in this specification.

EXAMPLE 2

The system LSI 100 in the first example (FIG. 1) outputs a desired termination voltage in consideration of a voltage drop caused by the resistance of a line external to the LSI core 110.

In a second example according to the present invention, a system LSI structured to generate a line resistance inside an LSI core will be described. The line resistance of the LSI core can be lower than the line resistance of the LSI core of the first example.

Figure 2:
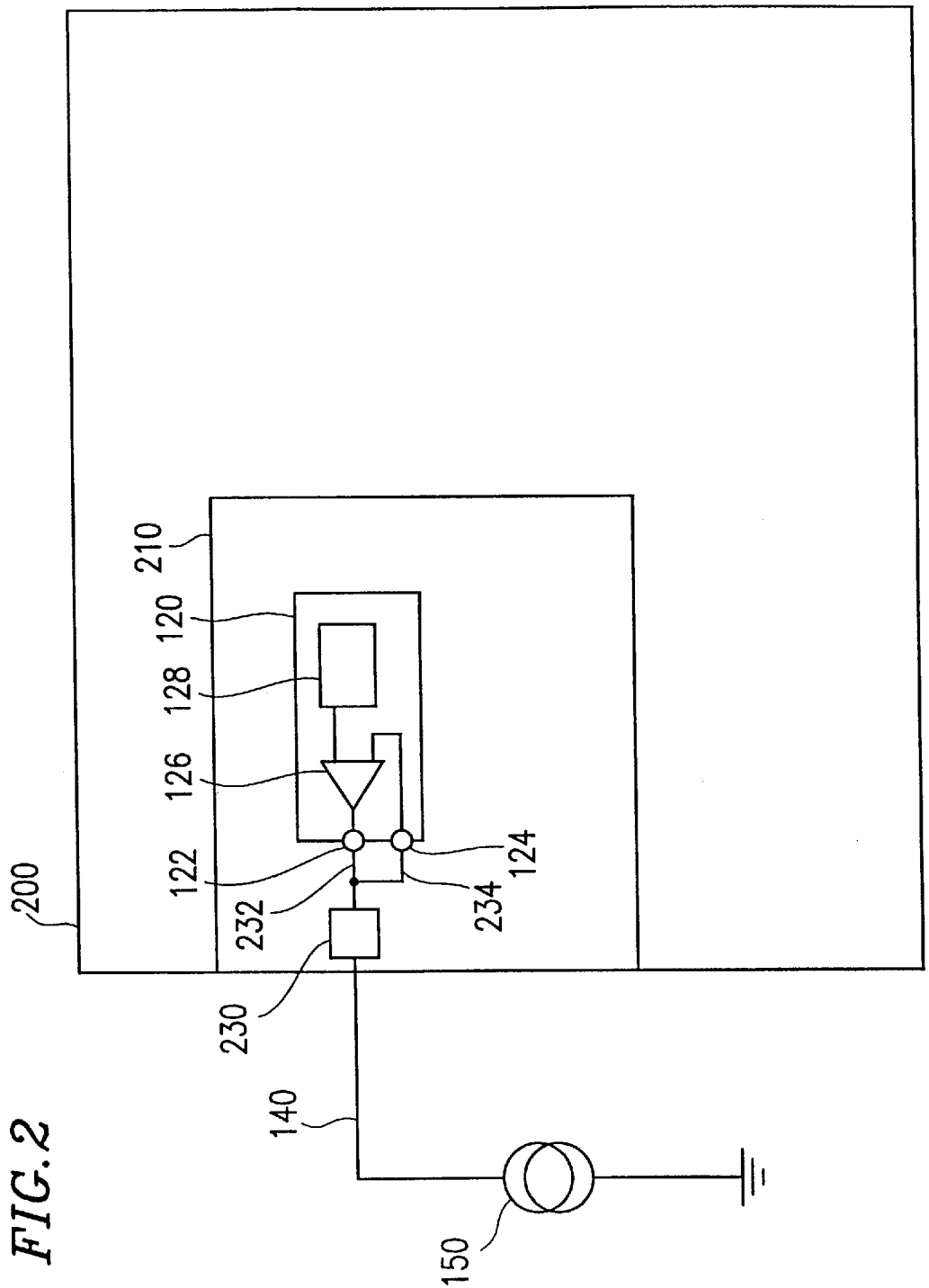
FIG. 2 is a block diagram illustrating a structure of a system LSI 200 in a second example of the present invention.

FIG. 2 is a block diagram illustrating an exemplary structure of a system LSI 200 in the second example.

The system LSI 200 is substantially different from the system LSI 100 (FIG. 1) in the first example in that an LSI core 210 incorporated in the system LSI 200 includes a pad 230 and a line connecting a termination voltage generation circuit 120 to the pad 230. Accordingly, the LSI core 210 can eliminate the need of the output terminal 112 and the monitor terminal 114 of the first example (both shown in FIG. 1). The LSI core 210 outputs a termination bus voltage of the system LSI 200 through the pad 230. Therefore, the LSI core 210 is located closer to one side of the system LSI 200 than in the first example, and is connected to an external bus line 140 through the pad 230.

Except for the above-mentioned points, the system LSI 200 has substantially the same structure as that of the system LSI 100 (FIG. 1). Identical elements previously discussed with respect to FIG. 1 bear identical reference numerals and the descriptions thereof will be omitted henceforth.

The LSI core 210 includes the termination voltage generation circuit 120 for generating a voltage having a prescribed level, the pad 230, a termination voltage supply line 232, and a voltage monitor line 234.

As described above with reference to FIG. 1, the termination voltage generation circuit 120 includes an output section 122, an input section 124, a comparator circuit 126, and a reference voltage generation circuit 128.

The output section 122 outputs a voltage from the comparator circuit 126 as a termination voltage. The output section 122 is directly connected to the pad 230 through the termination voltage supply line 232. Unlike the LSI core 110, the LSI core 210 does not include an output terminal. The termination voltage is output to the termination voltage supply line 232 and then output to the external bus line 140 through the pad 230 as a termination bus voltage.

The input section 124 receives the termination voltage output from the output section 122 in order to monitor the termination voltage. The input section 124 is connected to the voltage monitor line 234. The voltage monitor line 234 is connected to the termination voltage supply line 232 in the vicinity of the pad 230. Accordingly, the input section 124 can receive the termination bus voltage from the voltage monitor line 234, and therefore monitor the termination bus voltage. The termination bus voltage received by the input section 124 is input to the comparator circuit 126.

The pad 230 receives the termination voltage output from the output section 122 through the termination voltage supply line 232 and outputs the termination voltage to the external bus line 140 as a termination bus voltage.

When the system LSI 200 having the above-described structure is connected to the external bus line 140 having a current load 150, the level of the termination bus voltage is lowered from the level of the termination voltage due to the current load 150 and the resistance of the termination voltage supply line 232.

An exemplary operation of the termination voltage generation circuit 120 of the second example is substantially the same as the operation described in the first example and therefore, such a description will not be repeated here. The termination voltage generation circuit 120 can output a termination voltage in consideration of the voltage drop which is caused by the resistance of the termination voltage supply line 232. Accordingly, a desired termination bus voltage can be output from the pad 230 to the external bus line 140.

In the system LSI 200 of the second example, the single LSI core 210 includes the components of the termination voltage generation circuit 120 and the pad 230. Accordingly, the distance between the pad 230 and the termination voltage generation circuit 120, i.e., the length of the termination voltage supply line 232 is shorter than the length of the termination voltage supply line 132 (FIG. 1) of the system LSI 100 of the first example having the is pad 130 outside the LSI core 110. Since the resistance of a termination voltage supply line is in proportion to the length thereof, the resistance of the termination voltage supply line 232 is smaller than the resistance of the termination voltage supply line 132 in the first example. Since a voltage drop will be in proportion to the line resistance when the magnitude of the current load 150 remains the same, the system LSI 200 causes a smaller voltage drop than the system LSI 100.

The distance between the pad 230 and the termination voltage generation circuit 120 can be shorter still, and thus the magnitude of the voltage can also be smaller still. In this case, the line resistance is predictable. Therefore, the termination voltage generation circuit 120 can output a voltage higher than the desired voltage by the magnitude of the voltage drop caused by the predictable line resistance. As a result, the desired voltage can always be output from the pad 230. This alleviates the burden on system designers of the system LSI 200 and allows the system LSI 200 to be designed more quickly and more easily.

Since the single LSI core 210 includes the components of the termination voltage generation circuit 120 and the pad 230, the level of the resistance of the termination voltage supply line 232 is kept constant regardless of the type of system LSI in which the LSI core 210 is incorporated. Since the level of the line resistance is predictable, the termination voltage generation circuit 120 can output a voltage higher than the desired voltage by the magnitude of the voltage drop caused by the predictable line resistance. As a result, the desired voltage can always be output from the pad 230. This alleviates the burden on system designers of the system LSI 200 and allows the system LSI 200 to be designed more quickly and more easily.

The LSI core 210 eliminates the necessity of the output terminal 112 and the monitor terminal 114 (both shown in FIG. 1), which are required in the LSI core 110 of the first example (FIG. 1). Thus, the designing and production steps of providing the output terminal 112 and the monitor terminal 114 are eliminated.

EXAMPLE 3

In a third example according to the present invention, a system LSI for reducing an effective inductance of a line in the system LSI used for outputting a termination voltage, and thus reducing noise caused by the inductance will be described.

Figure 3:
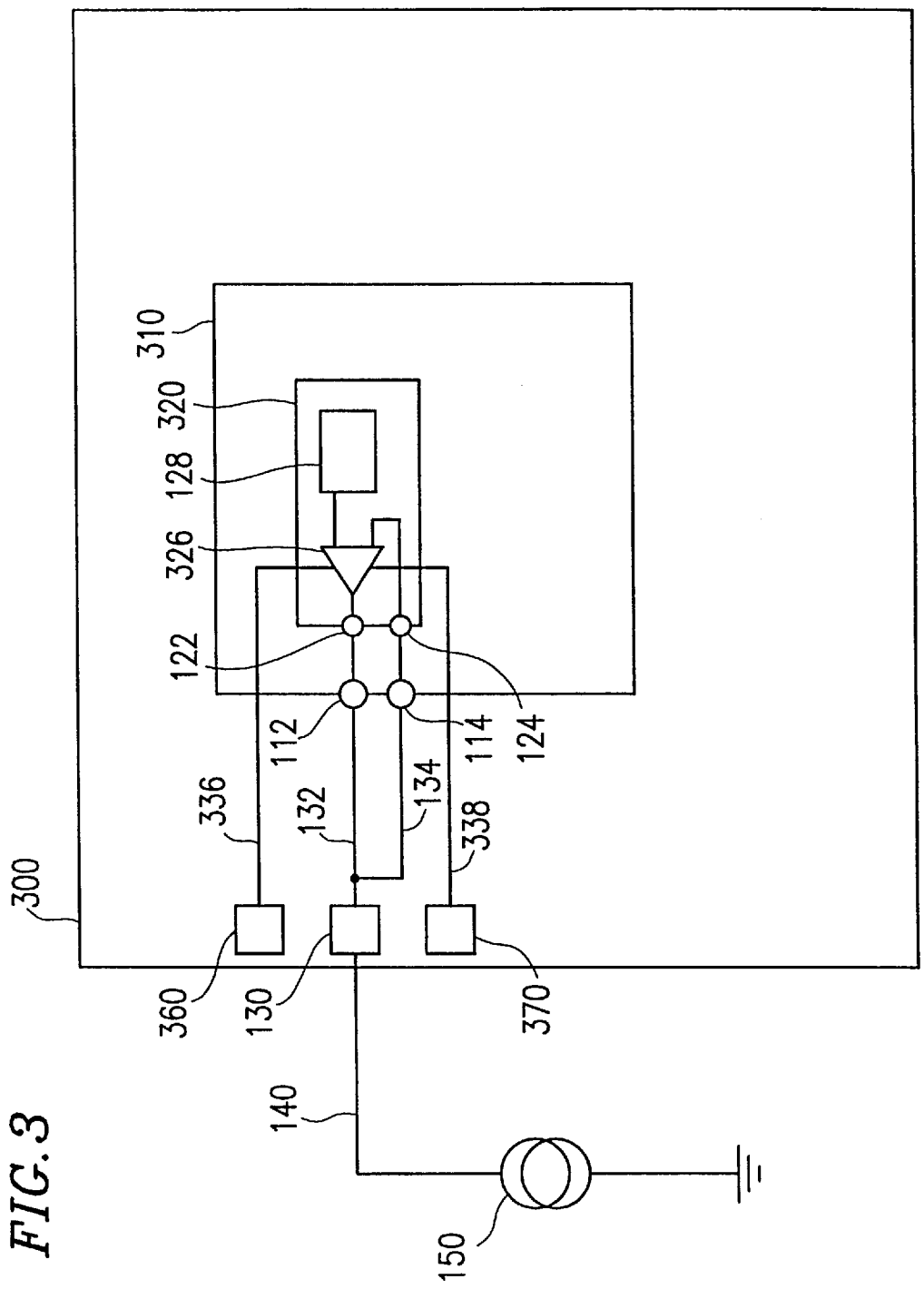
FIG. 3 is a block diagram illustrating a structure of a system LSI 300 in a third example of the present invention.

FIG. 3 is a block diagram illustrating an exemplary structure of a system LSI 300 in the third example according to the present invention. In the third example, identical elements previously discussed with respect to FIG. 1 bear identical reference numerals and the descriptions thereof will therefore be omitted.

The system LSI 300 includes power supply pads 360 and 370 for supplying power from a power supply (not shown) to a termination voltage generation circuit 320, and power supply lines 336 and 338 respectively for connecting the power supply pads 360 and 370 to a comparator circuit 326, in addition to the components included in the system LSI 100 (FIG. 1) of the first example. The power supply lines 336 and 338 extend from outside an LSI core 310 of the system LSI 300 to inside the LSI core 310. The system LSI 100 in the first example can have any structure for supplying power to the termination voltage generation circuit 120 and thus no explanation was provided regarding such a structure.

Both of the power supply lines 336 and 338 are provided in proximity of a termination voltage supply line 132.

Preferably, the power supply lines 336 and 338 are also in proximity of a line connecting the output terminal 112 of the LSI core 310 to an output section 122 of the termination voltage generation circuit 320. Due to the proximity of the power supply lines 336 and 338 to the termination voltage supply line 132, the effective inductance of the termination voltage supply line 132 is reduced. Thus, noise in the termination voltage supply line 132 generated by the inductance component is also reduced. Accordingly, the noise added to the termination bus voltage is reduced, as described below.

The system LSI 300 operates, for example, in the following manner.

As described above, the system LSI 300 includes the power supply pads 360 and 370, and the power supply lines 336 and 338 respectively connected to the power supply pads 360 and 370.

The power supply pads 360 and 370 receive power from a power supply (not shown) provided outside the system LSI 300. The power received by the power supply pads 360 and 370 is supplied to the comparator circuit 326 in the termination voltage generation circuit 320 respectively through the power supply lines 336 and 338.

The comparator circuit 326 receives a reference voltage from a reference voltage generation circuit 128 and a termination bus voltage which is input to an input section 124 and has a voltage level lowered from the level of the termination voltage, and compares the reference voltage and the termination bus voltage. In response to the comparison result, a control section of the termination voltage generation circuit 320 (not shown) can determine the difference between the termination bus voltage and the termination voltage. The control section increases the output voltage from the comparator circuit 326 by the amount of voltage drop and thus corrects the level of the termination voltage to be output from the termination voltage generation circuit 320. The comparator circuit 326 receives the power from the power supply lines 336 and 338, and utilizes the power to increase the voltage to generate the corrected output voltage. Then, the comparator circuit 326 outputs the generated voltage to the output section 122.

Figure 4:
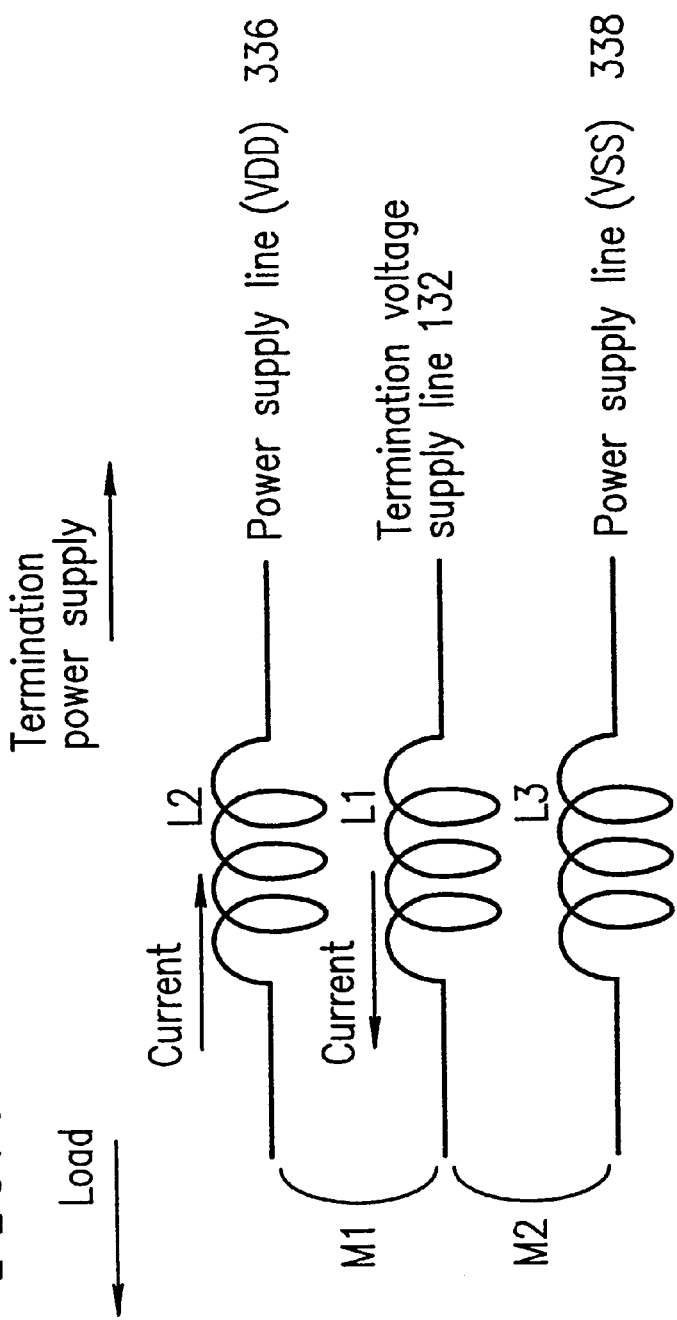
FIG. 4 is a schematic diagram illustrating inductances of a termination voltage supply line 132 and power supply lines 336 and 338, and directions in which a current flows in these lines in the third example of the present invention.
Figure 5:
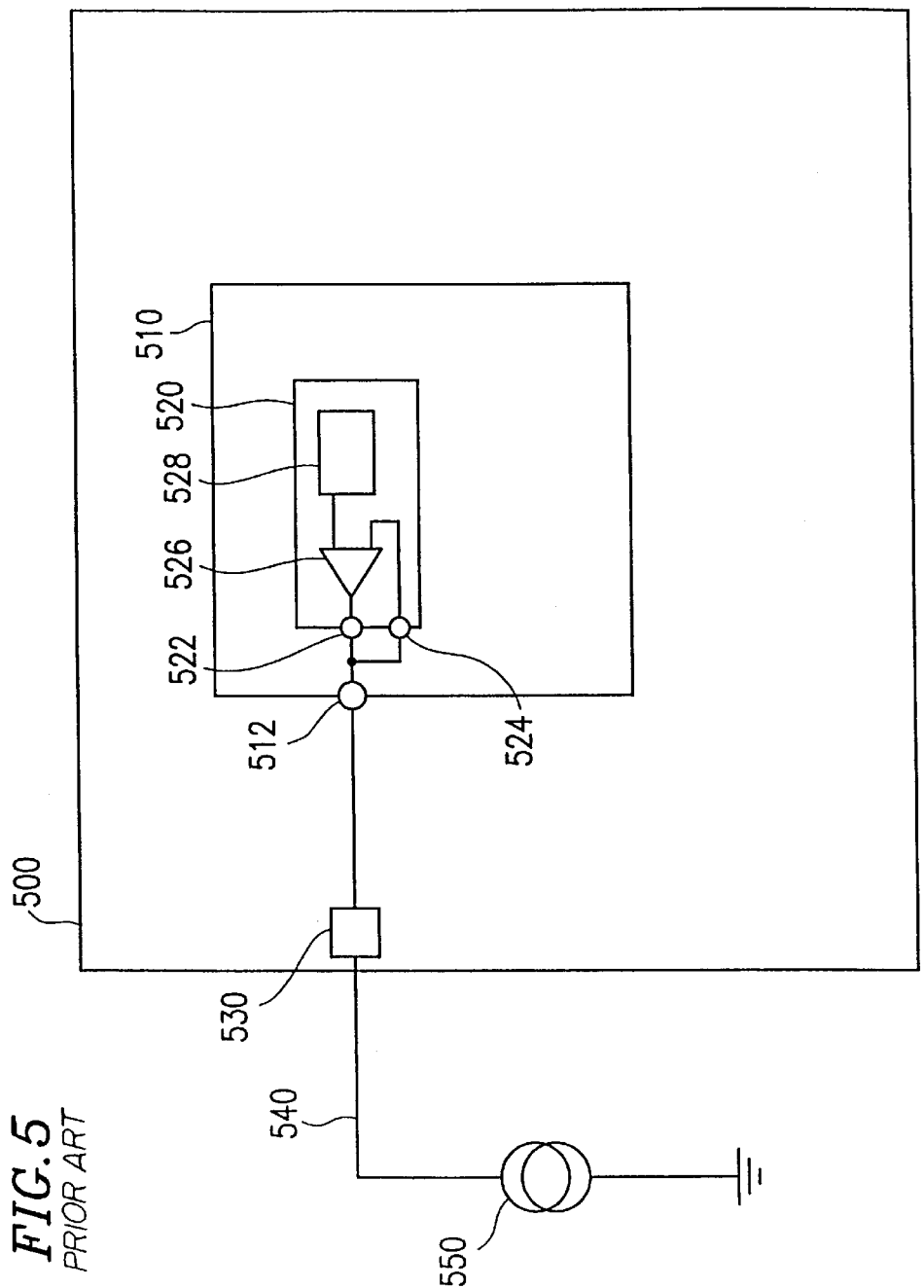
FIG. 5 is a block diagram illustrating a structure of a conventional system LSI 500 including a conventional IEEE 1394 physical layer LSI core 510.

FIG. 4 is a schematic diagram illustrating inductances of the termination voltage supply line 132 and the power supply lines 336 and 338, and directions in which the current flows in these lines.

The termination voltage supply line 132 and the power supply lines 336 and 338 respectively have self-inductances L1, L2 and L3. The termination voltage supply line 132 and the power supply line 336 are provided in proximity of each other as described above, and thus a mutual inductance M1 is present therebetween. Similarly, the termination voltage supply line 132 and the power supply line 338 are provided in proximity of each other as described above, and thus a mutual inductance M2 is present therebetween.

To use a voltage level as a signal, a reference voltage having a certain level is set and it is determined whether the level of a termination voltage is higher or lower than the level of the reference voltage. When the level of the termination voltage is lower than the level of the reference voltage (i.e., when the current flows in the direction of being pulled into the load, i.e., the current load 150 in FIG. 3), the current flows toward the current load 150 along the termination voltage supply line 132. The current flows toward the termination voltage generation circuit 320 (FIG. 3) in the power supply line 336. Namely, the direction of the current flowing in the termination voltage supply line 132 is opposite to the direction of the current flowing in the power supply line 336. In this case, the effective inductance of the termination voltage supply line 132 is (L1-M1) and therefore is appreciated to be smaller than the self-inductance L1 of the termination voltage supply line 132. Accordingly, the noise generated by the inductance component can be suppressed low. Since no current flows in the power supply line 338, the influence of the mutual inductance M2 on the effective inductance of the termination voltage supply line 132 does not need to be considered.

When the level of the termination voltage is higher than the level of the reference voltage (i.e., when the current flows in the direction of being pushed from the load, i.e., the current load 150 in FIG. 3), the current flows toward the termination voltage generation circuit 320 (FIG. 3) along the termination voltage supply line 132. The current in the power supply line 338 flows toward the current load 150. Namely, the direction of the current flowing in the termination voltage supply line 132 is opposite to the direction of the current flowing in the power supply line 338. In this case, the effective inductance of the termination voltage supply line 132 is (L1-M2) and therefore is appreciated to be smaller than the self-inductance L1 of the termination voltage supply line 132.

As described above, the noise to the voltage signal in the termination voltage supply line 132 can be suppressed by locating the termination voltage supply line 132 in proximity of the power supply lines 336 and 338.

In the third example, the termination voltage supply line 132 is located in proximity of the power supply lines 336 and 338 two-dimensionally. The same effect is achieved when a plurality of lines are located in a stacked manner three-dimensionally by a multiple layer wiring technology.

According to the present invention, the input section of the generation voltage circuit receives, through the second terminal, a voltage which has been output outside the LSI care. Since the voltage which has been once output outside the LSI core from the voltage generation circuit is re-input to the voltage generation circuit, even when the level of the voltage is changed outside the LSI core, the voltage generation circuit can monitor the changed level of the voltage.

In an embodiment in which the second terminal is provided in the vicinity of the pad, the voltage which is output outside the system LSI from the pad can be monitored.

In an embodiment in which the third line for supplying power to the voltage generation circuit is provided in proximity of the first line, an effective inductance of the first line for supplying the voltage to the pad can be reduced, and thus noise caused by the inductance component can be reduced.

In an embodiment in which the pad and the voltage generation circuit are provided in the LSI core and the system LSI outputs a voltage generated in the voltage generation circuit using the pad of the LSI core, the distance between the pad and the voltage generation circuit is shorter than the case in which the pad is provided outside the LSI core. Accordingly, the resistance of the line from the voltage generation circuit to the pad is smaller, and thus the voltage drop can be reduced. In an embodiment in which the distance between the pad and the voltage generation circuit in the LSI core are shorter still, the magnitude of the voltage drop can be further reduced. Since the line resistance is predictable in such a case, the voltage generation circuit can output a voltage which is higher than the desired voltage by an amount of the voltage drop caused by the predictable line resistance. Thus, a desired voltage can always be output from the pad. This alleviates the burden on system designers of the system LSI and allows the system LSI to be designed more quickly and more easily.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An LSI core, comprising:

a first terminal;

a second terminal; and a voltage generation circuit for generating a voltage, wherein:

the first terminal is connected to a first external line provided outside the LSI core, the second terminal is connected to the first external line by way of a second external line provided outside the LSI core, and the voltage generation circuit includes:

a voltage generation section for generating the voltage, an output section for outputting the voltage generated by the voltage generation section to the first external line through the first terminal, and an input section for receiving the voltage, output to the first external line by the output section, through the second external line and the second terminal.

2. An LSI core according to claim 1, wherein the LSI core is a physical layer LSI core conforming to the IEEE 1394 standards.

3. A system LSI, comprising:

an LSI core;

a pad;

a first line connected to the pad; and a second line connected to the first line, wherein:

the LSI core includes a first terminal, a second terminal, and a voltage generation circuit for generating a voltage, the first terminal is connected to the first line provided outside the LSI core, the second terminal is connected to the second line provided outside the LSI core, the voltage generation circuit includes:

a voltage generation section for generating the voltage, an output section for outputting the voltage generated by the voltage generation section to the first line through the first terminal, and an input section for receiving the voltage, output to the first line by the output section, through the second line and the second terminal, and the second line is connected to the first line in the vicinity of the pad.

4. A system LSI according to claim 3, further comprising a third line for supplying power to the voltage generation circuit, wherein the third line is provided in proximity of the first line.

5. A system LSI according to claim 3, wherein the LSI core is a physical layer LSI core conforming to the IEEE 1394 standards.

6. A system LSI according to claim 4, wherein the LSI core is a physical layer LSI core conforming to the IEEE 1394 standards.

* * * * *